(12) United States Patent
Chiu et al.

(10) Patent No.: US 12,100,624 B2
(45) Date of Patent: Sep. 24, 2024

(54) SEMICONDUCTOR DEVICE AND METHOD OF FABRICATING THE SAME

(71) Applicant: UNITED MICROELECTRONICS CORP., Hsin-Chu (TW)

(72) Inventors: Ta-Wei Chiu, Changhua County (TW); Ping-Hung Chiang, Hsinchu (TW); Chia-Wen Lu, Tainan (TW); Chia-Ling Wang, Yunlin County (TW); Wei-Lun Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 333 days.

(21) Appl. No.: 17/672,638

(22) Filed: Feb. 15, 2022

(65) Prior Publication Data

US 2023/0223306 A1 Jul. 13, 2023

(30) Foreign Application Priority Data

Jan. 10, 2022 (TW) ................... 111100966

(51) Int. Cl.
*H01L 21/8234* (2006.01)
*H01L 21/762* (2006.01)
*H01L 27/088* (2006.01)
*H01L 29/06* (2006.01)
*H01L 29/423* (2006.01)

(52) U.S. Cl.
CPC ........ *H01L 21/823481* (2013.01); *H01L 21/76224* (2013.01); *H01L 27/088* (2013.01)

(58) Field of Classification Search
CPC ..... H01L 21/823462; H01L 21/823857; H01L 21/823481; H01L 21/823878; H01L 21/76224; H01L 21/76229; H01L 27/0922; H01L 29/42364; H01L 29/7834
See application file for complete search history.

(56) References Cited

U.S. PATENT DOCUMENTS

| 8,546,268 B2 | 10/2013 | Entalai et al. |
| 10,892,182 B2 | 1/2021 | Liew et al. |
| 2002/0111046 A1 | 8/2002 | Park et al. |
| 2003/0067050 A1 | 4/2003 | Kim |
| 2008/0124872 A1 | 5/2008 | Verma et al. |
| 2013/0292765 A1* | 11/2013 | Kojima ........... H01L 21/823814 257/338 |

FOREIGN PATENT DOCUMENTS

CN 113764505 A * 12/2021

* cited by examiner

*Primary Examiner* — Sonya McCall-Shepard
(74) *Attorney, Agent, or Firm* — Winston Hsu

(57) ABSTRACT

Semiconductor device and method of fabricating the same, the semiconductor device includes a substrate, a first transistor, a second transistor, a third transistor, and a plurality of shallow trench isolations. The first transistor is disposed in a medium-voltage region and includes a first plane, a first gate dielectric layer, and a first gate electrode. The second transistor is disposed in a boundary region and includes a second plane, a second gate dielectric layer, and a second gate electrode. The third transistor is disposed in a lower-voltage region and includes a third plane, a third gate dielectric layer, and a third gate electrode. The shallow trench isolations are disposed in the substrate, wherein top surfaces of the shallow trench isolations in the medium-voltage region, the boundary region and the low-voltage region are coplanar with top surfaces of the first gate dielectric layer and the second gate dielectric layer.

3 Claims, 12 Drawing Sheets

SEMICONDUCTOR DEVICE AND METHOD OF FABRICATING THE SAME

BACKGROUND OF THE INVENTION

1. Field of the Invention

The present disclosure relates generally to a semiconductor device and a method of fabricating the same, and more particularly to a semiconductor device including a medium-voltage (MV) component, and a low-voltage (LV) component together and a method of fabricating the same.

2. Description of the Prior Art

According to the current semiconductor technology, it is able to integrate control circuits, memories, low-voltage operating circuits, and high-voltage operating circuits and components on a single chip together, thereby reducing costs and improving operating efficiency. In addition, as the size of semiconductor components becomes smaller and smaller, there are many improvements in the process steps of forming transistors to fabricate transistors with small volume and high quality. However, as the size of devices continues to decrease, it becomes more difficult to dispose medium-voltage components and low-voltage components on the same semiconductor device together, and the processes of forming the semiconductor device also faces many limitations and challenges.

SUMMARY OF THE INVENTION

An object of the present disclosure is to provide a semiconductor device, where a plurality of transistors with the same height, and a plurality of shallow trench isolation with the same depth are disposed within a medium-voltage region, a low-voltage region, and a boundary region between the medium-voltage region and the low-voltage region, respectively. Therefore, it is sufficient to avoid the obvious height differences between various regions of the semiconductor device, so as to improve the device functions and the performances.

An object of the present disclosure is to provide a method of fabricating a semiconductor device, which integrates the fabrications of medium-voltage components and low-voltage components, so as to form the medium-voltage components and low-voltage components through a simplified process flow, and also, to prevent from serious loading effect occurred at the boundary region between the medium-voltage components and the low-voltage components.

To achieve the aforementioned objects, the present disclosure provides a method of fabricating a semiconductor device that includes the following steps. Firstly, a substrate is provided and which has a medium-voltage region, a low-voltage region and a boundary region between the medium-voltage region and the low-voltage region. Next, a plurality of shallow trench isolations is formed in the substrate within the medium-voltage region, the boundary region, and the low-voltage region, and top surfaces of the shallow trench isolations within the medium-voltage region, the boundary region, and the low-voltage region are coplanar with each other. Then, the substrate and the shallow trench isolations in the medium-voltage region and the boundary region are partially removed, wherein the shallow trench isolations in the medium-voltage region and the boundary region have a first top surface lower than the top surface of the shallow trench isolations in the low-voltage region. Following these, a first gate dielectric layer is formed on a first plane of the substrate, within the medium-voltage region. Finally, the substrate and the shallow trench isolation in the low-voltage region are partially removed, wherein the substrate and the shallow trench isolation in the low-voltage region have a second top surface being coplanar with a top surface of the first gate dielectric layer.

To achieve the aforementioned objects, the present disclosure provides a semiconductor device that includes a substrate, a first transistor, a second transistor, a third transistor, and a plurality of shallow trench isolations. The substrate has a medium-voltage region, a low-voltage region, and a boundary region between the medium-voltage region and the low-voltage region. The first transistor is disposed in the medium-voltage region and includes a first plane, a first gate dielectric layer, and a first gate electrode. The first plane is disposed on the substrate, the first gate dielectric layer is disposed on the first plane, and the first gate electrode is disposed on the first gate dielectric layer. The second transistor is disposed in the boundary region and includes a second plane, a second gate dielectric layer, and a second gate electrode. The second plane is disposed on the substrate, the second gate dielectric layer is disposed on the second plane, and the second gate electrode is disposed on the second gate dielectric layer. The third transistor is disposed in the low-voltage region and includes a third plane, a third gate dielectric layer and a third gate electrode. The third plane is disposed on the substrate, the third gate dielectric layer is disposed on the third plane, and the third gate electrode is disposed on the third gate dielectric layer. The shallow trench isolations are disposed in the substrate, within the medium-voltage region, the boundary region and the low-voltage region respectively, wherein top surfaces of the shallow trench isolations in the medium-voltage region, the boundary region and the low-voltage region are coplanar with top surfaces of the first gate dielectric layer and the second gate dielectric layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

FIG. 1 to FIG. 4 illustrates schematic diagrams of a method of fabricating a semiconductor device according to a first embodiment of the present disclosure, in which:

FIG. 1 is a schematic cross-sectional view of a semiconductor device after forming shallow trench isolations;

FIG. 2 is a schematic cross-sectional view of a semiconductor device after performing an etching process;

FIG. 3 is a schematic cross-sectional view of a semiconductor device after forming an oxide layer; and FIG. 4 is a schematic cross-sectional view of a semiconductor device after forming gate electrodes.

FIG. 5 to FIG. 12 illustrates schematic diagrams of a method of fabricating a semiconductor device according to a second embodiment of the present disclosure, in which:

FIG. 5 is a schematic cross-sectional view of a semiconductor device after forming shallow trench isolations;

FIG. 6 is a schematic cross-sectional view of a semiconductor device after forming a mask layer;

FIG. 7 is a schematic cross-sectional view of a semiconductor device after performing a first etching process;

FIG. 8 is a schematic cross-sectional view of a semiconductor device after performing an oxidation process;

FIG. 9 is a schematic cross-sectional view of a semiconductor device after performing a second etching process;

FIG. 10 is a schematic cross-sectional view of a semiconductor device after forming an oxide layer;

FIG. 11 is a schematic cross-sectional view of a semiconductor device after performing a third etching process; and FIG. 12 is a schematic cross-sectional view of a semiconductor device after forming gate electrodes.

DETAILED DESCRIPTION

Figure 1:
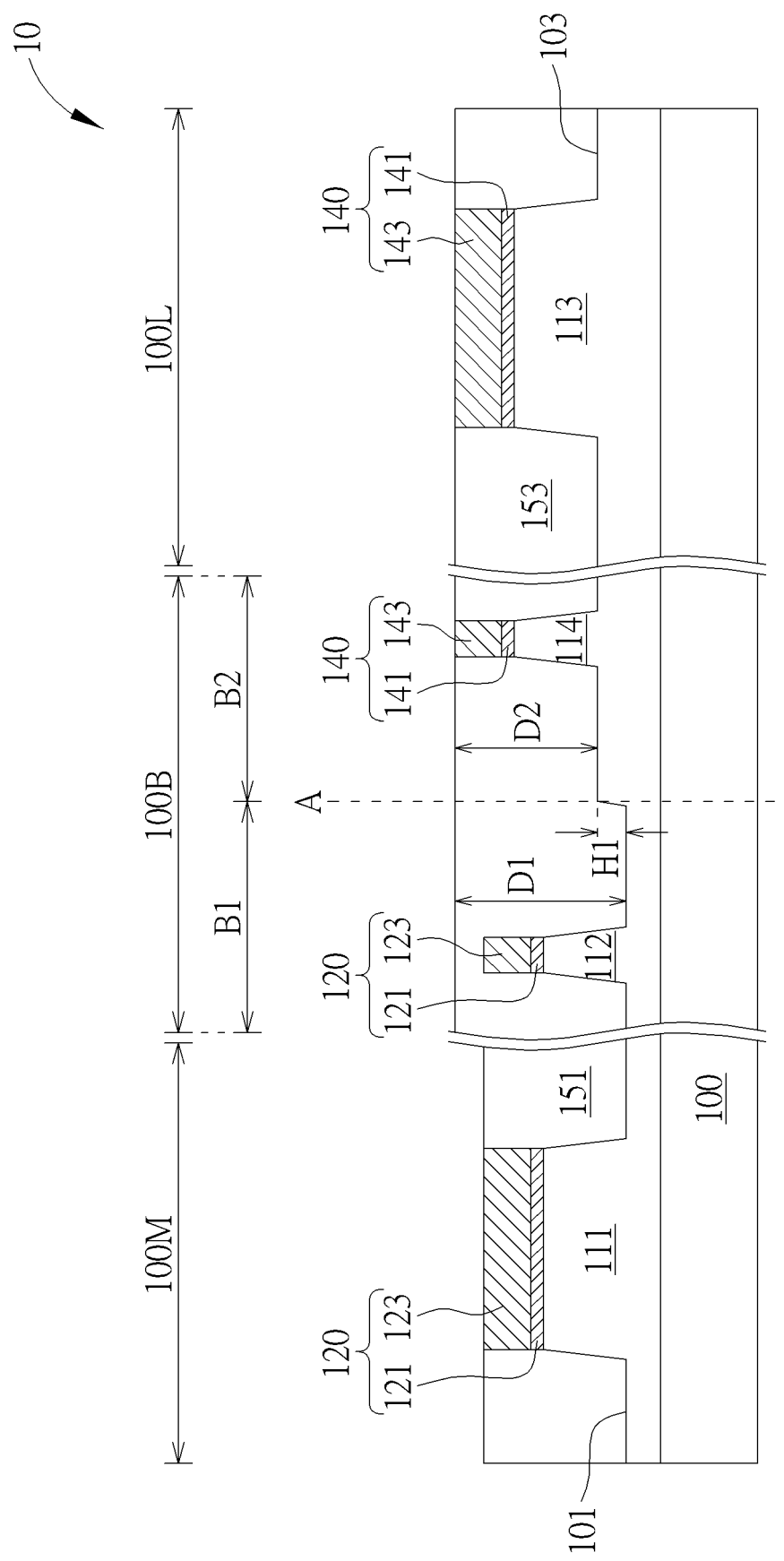

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

The present disclosure relates to a method of fabricating a semiconductor device, which integrates the fabrication methods of a medium-voltage (MV) component, and a low-voltage (LV) component. The medium-voltage component may refer to semiconductor transistors with an initial voltage between 5 volts and 10 volts, and the low-voltage component may refer to semiconductor transistors with an initial voltage between 0.5 volt and 1 volt, but not limited thereto. Please refer to FIG. 1 to FIG. 4, which are schematic diagrams of a method of fabricating a semiconductor device 10 according to the first embodiment of the present disclosure.

Firstly, a bulk substrate (not shown in the drawings) is provided, which includes for example a silicon substrate, an epitaxial silicon substrate, a silicon-containing substrate, or a silicon-on-insulator (SOI) substrate, but not limited thereto. Then, a thick gate recessing (TGR) process is performed and which includes but is not limited to the following process. First, a mask structure (not shown in the drawings) is formed to cover a first region (not shown in the drawings) of the bulk substrate, and to expose a second region (not shown in the drawings) of the bulk substrate. Next, an oxidation process such as a thermal oxidation process is performed on the second region, to partially oxidize the second region to form an oxide layer (not shown in the drawings). The oxide layer has a height H1, which may be about 300 angstroms (Å) to 500 angstroms, but is not limited thereto. Then, the oxide layer is completely removed through an etching process, to form a substrate 100 having a height difference H1 between two regions of the substrate 100, as shown in FIG. 1.

Next, as shown in FIG. 1, a plurality of shallow trench isolations 151, 153 is formed in the substrate, and the formation thereof includes but is not limited to the following process. Firstly, a mask structure 120 and a mask structure 140 are respectively formed in the two regions of the substrate 100, and the mask structure 120 and the mask structure 140 individually include a first layer 121, 141 (for example including silicon oxide), and a second layer 123, 143 (for example including silicon nitride) stacked from bottom to top, but is not limited thereto. Then, an etching process is performed through the mask structure 120 and the mask structure 140 to define a plurality of active areas 111, 112 and a plane 101 between the active areas 111, 112, and also, to define a plurality of active areas 113, 114 and a plane 103 between the active areas 113, 114. Then, a deposition process and a planarization process are sequentially performed to form a plurality of shallow trench isolations 151, 153 in the substrate 100. It is noted that, since the substrate 100 has the height difference H1 between various regions, the disposing positions of the mask structure 120 and the mask structure 140 also include the same height difference H1 in corresponding thereto. Accordingly, the planes 101, 103 and the active areas 111, 112, 113, 114 which are defined through the mask structure 120 and the mask structure 140 may also include same height difference H1 therebetween, as shown in FIG. 1. For these reasons, while performing the planarization process, the second layer 143 of the mask structure 140 which is relative higher is used as an etching stop layer, and the shallow trench isolations 151 and the shallow trench isolations 153 may therefore obtain different depths D1, D2. The shallow trench isolations 151 have a relative greater depth D1 to cover the top surface of the mask structure 120 with a relative lower height, and the shallow trench isolations 153 have a relative smaller depth D2 with a top surface thereof to be flush with the top surface of the second layer 143 of the mask structure 140. In addition, the shallow trench isolations 151 and the shallow trench isolations 153 may be separately from each other by a boundary line "A", as shown in FIG. 1.

With these arrangements, at least three regions may be defined in the substrate 100 of the present embodiment, for example including a first region having the plane 101 and the active area 111 both with the relative lower height, which may be used as a medium-voltage region 100M of the substrate 100 for forming medium-voltage components such as semiconductor transistors suitable for medium-voltage operation; a second region having the plane 103 and the active area 113 with a relative higher height, which may be used as a low-voltage region 100L of the substrate 100 for forming low-voltage components such as semiconductor transistors suitable for low-voltage operation; and a boundary region 100B between the medium-voltage region 100M and the low-voltage region 100L. The boundary region 100B has both the planes 101, 103 and the active areas 112, 114, so as to cover the boundary line "A" between the shallow trench isolations 151 and the shallow trench isolations 153, wherein the boundary region 100B may further be divided into a first boundary region B1 closed to the medium-voltage region 100M, and a second boundary region B2 closed to the low-voltage region 100L. The first boundary region B1 also includes the plane 101 and the active area 112 with the relative lower height, the second boundary B2 also includes the plane 103 and the active area 114 with the relative higher height, and the boundary line "A" is disposed between the first boundary region B1 and the second boundary region B2. In addition, in one embodiment, a horizontal distance of the first boundary region B1 and/or the second boundary region B2 may be about 10 micrometers, but is not limited thereto. People well skilled in the art should easily understand that the medium-voltage region 100M and the boundary region 100B, or the low-voltage region 100L and the boundary region 100B in the present embodiment may be optionally directly in contact with each other or not in contact with each other. For example, a high-voltage region (HV region, not shown in the drawings) may be additionally disposed between the medium-voltage region 100M and the boundary region 100B, but not limited thereto. It is noted that, due to the influence of pattern density and loading effect, the dishing caused by excessive polishing may be easily occurred in a region with a relative lower pattern density, after performing the planarization process. For example, the second layer 123 within the medium-voltage region 100M (with a relative lower pattern density) may be exposed, and the second layer 123 within the first boundary region B1 (with a relative higher pattern density) may still be covered by the shallow trench isolations 151, as shown in FIG. 1.

Figure 2:
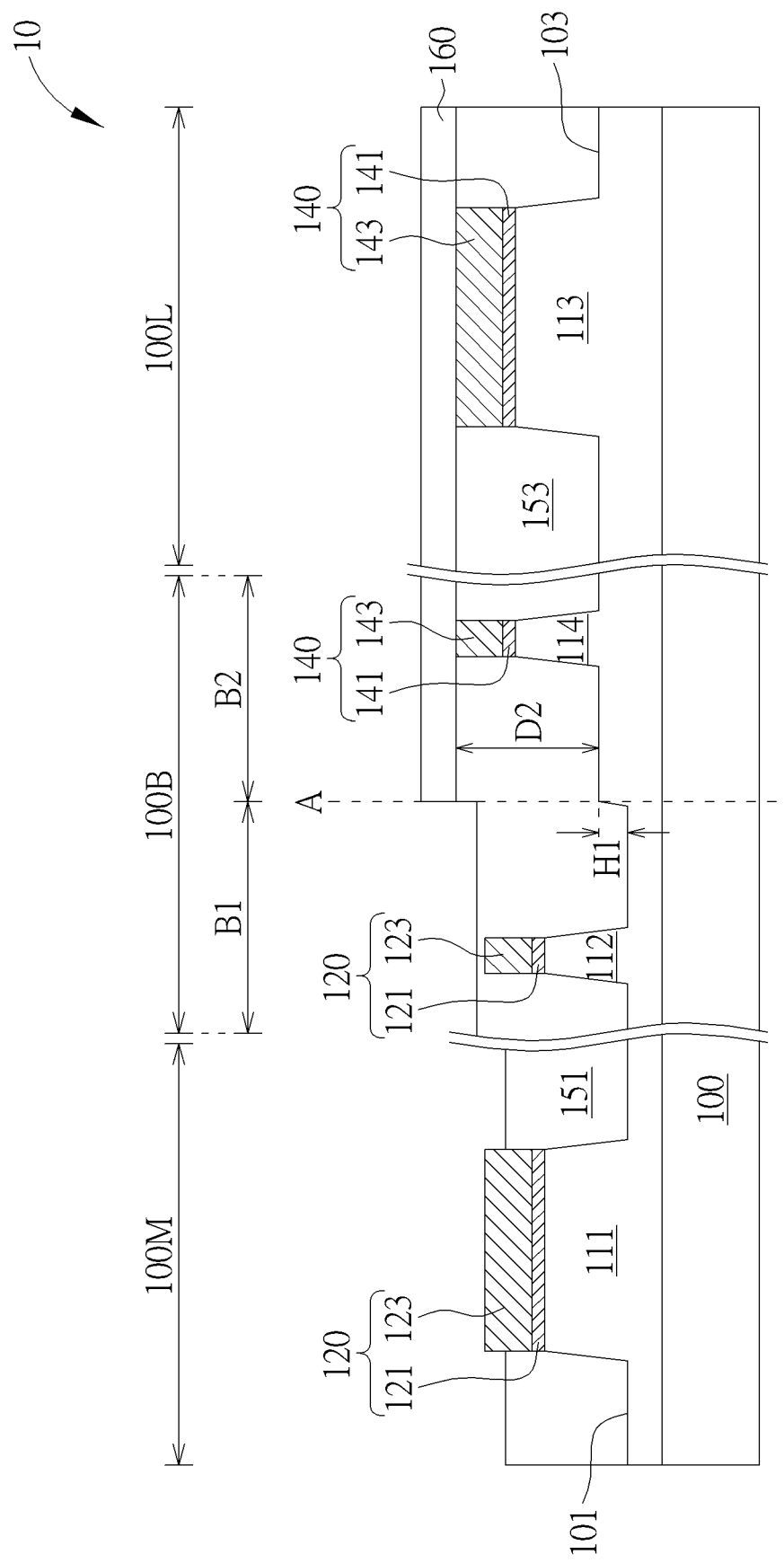
Figure 3:
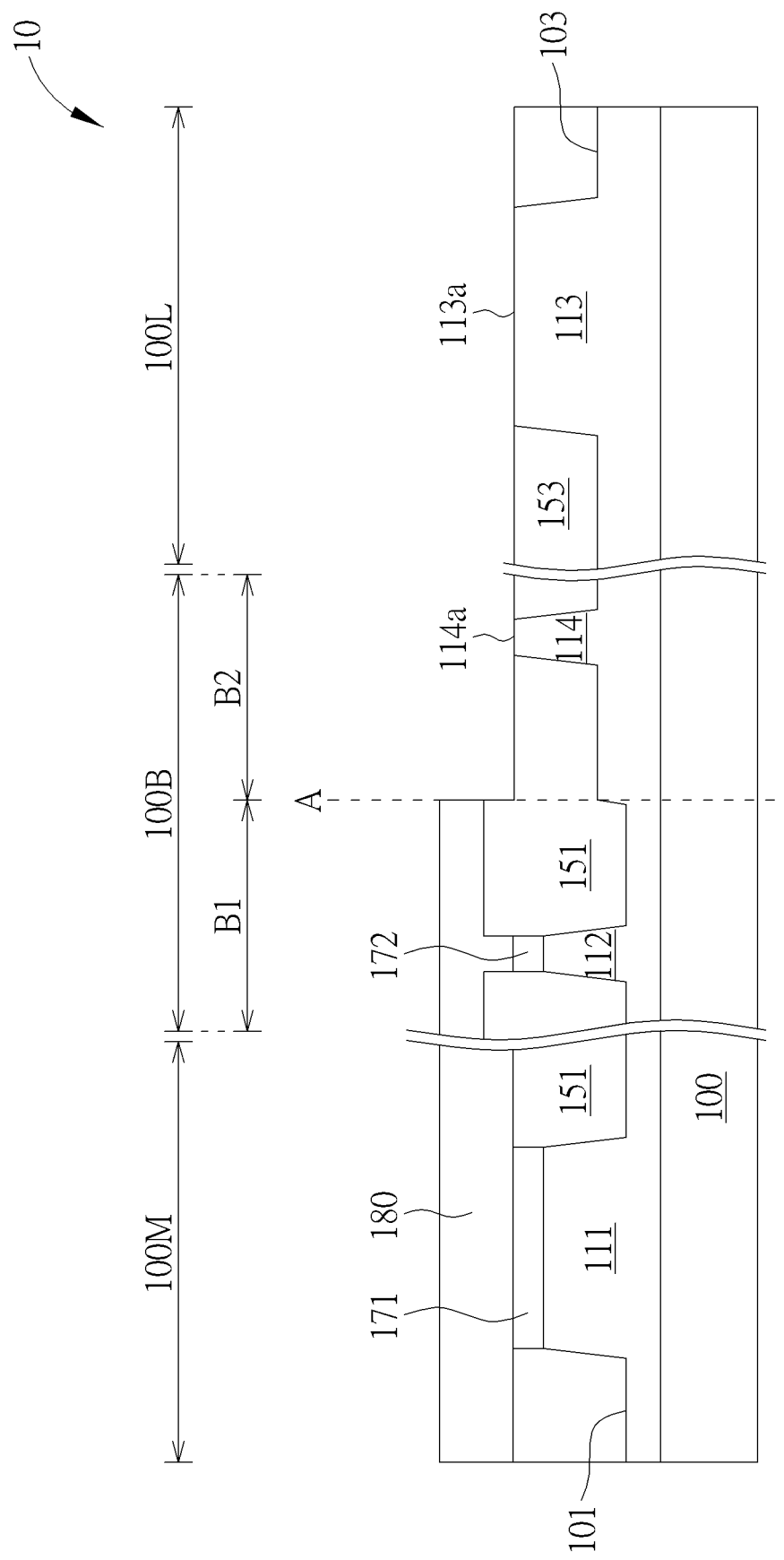

As shown in FIG. 2, a mask layer 160 is formed to cover on the low-voltage region 100L and the second boundary region B2, and an etching process is performed through the mask layer 160 to partially remove the shallow trench isolations 151 for controlling the step height of the shallow trench isolations 151, and to expose the second layer 123 of the mask structure 120 disposed above the active area 111. Next, another etching process is performed after removing the mask layer 160, to completely remove the mask structures 120, 140, and a portion of the shallow trench isolations 151, 153, to expose the top surface of each active area 111, 112, 113, 114. Then, another oxidation process such as a thermal oxidization process is performed, to form oxide layers 171, 172 on the top surfaces of the active areas 111, 112, and also, to form oxide layers (not shown in the drawings) on the top surfaces of the active areas 113, 114 respectively, as shown in FIG. 3. The oxide layer 171 may be served as a gate dielectric layer of the medium-voltage component.

Figure 4:
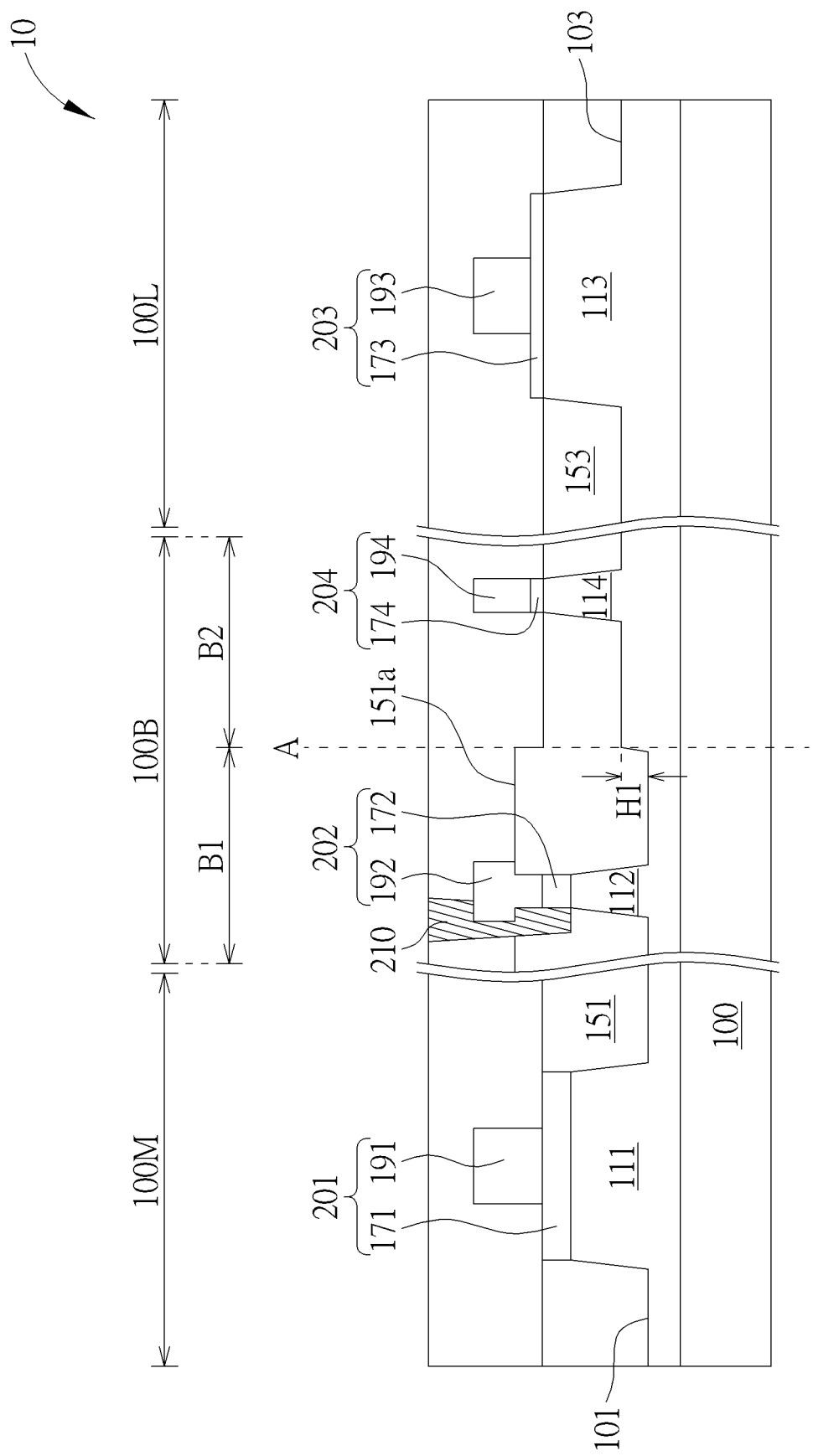

After that, as shown in FIG. 3, a mask layer 180 is formed to cover on the medium-voltage region 100M and the first boundary region B1, and an etching process is performed through the mask layer 180 to completely remove the oxide layers formed on the active areas 113, 114 and to partially remove the shallow trench isolations 153, thereby exposing planes 113a, 114a on the top of the active areas 113, 114. Accordingly, the planes 113a, 114a of the active areas 113, 114 within the lower-voltage region 100L and the second boundary region B2 may be substantially coplanar with the top surfaces of the shallow trench isolations 151, 153, as shown in FIG. 3. Following these, the mask layer 180 may be removed, and then, as shown in FIG. 4, gate dielectric layers 173, 174 of the low-voltage components are respectively formed on the planes 113a, 114a. Finally, a plurality of gate electrodes 191, 192, 193, 194 are formed simultaneously, to dispose on the oxide layers 171, 172 and on the gate dielectric layers 173, 174 respectively, so that a transistor 201 within the medium-voltage region 100M, transistors 202, 204 within the boundary region 100B, and a transistor 203 within the low-voltage region 100L are together formed.

Through the aforementioned processes, the fabrication of the semiconductor device 10 according to the first embodiment of the present disclosure is accomplished. In the fabricating method of the present embodiment, the thick gate recessing is firstly performed to produce the height difference H1 of the substrate 100, followed by performing the etching process as shown in FIG. 2, to control the step height of the h isolations 151 within the medium-voltage region 100M. Accordingly, the thickness of the gate dielectric layer (namely the oxide layer 171) may be precisely controlled through performing another oxidation process, such that, the top surface of the gate dielectric layer (namely the oxide layer 171) may be coplanar with the shallow trench isolations 151 within the medium-voltage region 100M. Furthermore, the thickness of the oxide layer formed within the low-voltage region 100L may also be controlled through performing the another oxidation process, so that, the oxide layer formed within the low-voltage region 100L may be completely removed in the subsequent etching process as shown in FIG. 3. Then, the active area 113 within the low-voltage region 100L may therefore obtain the plane 113a which is flush with the top surfaces of the shallow trench isolations 151 and the gate dielectric layer (namely the oxide layer 171) within the medium-voltage region 100M. Meanwhile, while removing the oxide layer within the low-voltage region 100L, the shallow trench isolations 153 may also be partially removed. Then, the top surfaces of the shallow trench isolations 153 within the low-voltage region 100L and the second boundary region B2 may be flush with the top surface of the shallow trench isolations 151 within the medium-voltage region 100M. In this way, the fabricating method of the present embodiment enables to gradually improve the serious height difference of the substrate 110 between the medium-voltage region 100M and the low-voltage region 100L caused by the thicker thickness of the gate dielectric layer within the medium-voltage region 100M, and which is beneficial on integrating the fabrication of the medium-voltage components and the fabrication of the low-voltage components, so as to enhance the element performance of the semiconductor device 10.

On the other hand, in the semiconductor device 10 of the present embodiment, the transistors 201, 202, 203, 204 are respectively disposed within various regions to apply to different voltage ranges, wherein the transistor 201 disposed within the medium-voltage region 100M may be apply to a medium-voltage operation, the transistor 203 disposed within the low-voltage region 100L may be apply to a low-voltage operation, and the transistors 202, 204 disposed within the boundary region 100B may be served as dummy gate structures or apply to other voltage ranges. It is noted that, in the present embodiment, the top surfaces of the transistors 201, 202, 203, 204 disposed in each region may be coplanar with each other, and the top surface of the shallow trench isolations 151 disposed in the medium-voltage region 100M and the top surface of the shallow trench isolations 153 disposed in the low-voltage region 100L may be coplanar with each other, and also be flush with the top surface of the gate dielectric layer (namely the oxide layer 171) of the transistor 201. In this way, the semiconductor device 10 of the present embodiment may therefore include transistors 201, 202, 203, 204 with the same height, as well as the shallow trench isolations 151, 153 with the same depth, for achieving more optimized device performance.

However, people well known in the arts should easily realize the semiconductor device in the present disclosure is not limited to the aforementioned embodiment, and may further include other examples or variety in order to meet the practical requirements. As an example, in the aforementioned fabricating processes, due to the height difference H1 of the substrate 100, the serious loading effect may be occurred around the boundary line "A" (namely, in the boundary region 100B) while performing the planarization process. For these reasons, more residues of the shallow trench isolations 151 may be remained on the active area 112 in the first boundary region B1, as shown in FIG. 2, so that, the top surface of the shallow trench isolations 151 within the first boundary region B1 may not be coplanar with the top surface of the shallow trench isolations 151, 153 in other regions (including the medium-voltage region 100M, the second boundary region B2, and the low-voltage region 100L) during the subsequent etching process. Then, an obvious step height may be formed around the boundary between the medium-voltage region 100M and the boundary region 100B of the substrate 100, as shown in FIG. 3. In this way, the shallow trench isolations 151 in the first boundary region B1 may therefore obtain a relative higher top surface 151a, and the gate electrode 192 formed thereon in the subsequent process may easily obtain a structure with uneven thickness as shown in FIG. 4. Accordingly, while forming a plug electrically connected to the gate electrode 192, such as a plug 210 as shown in FIG. 4, the plug 210 may penetrate through the thinner portion of the gate electrode 192 to close to the active area 112 underneath, thereby resulting in possible short circuit issue or the like.

The present disclosure further provide other examples or variety of a semiconductor device to improve the flatness between each region in the semiconductor device, especially in the boundary region between the medium-voltage region and the low-voltage region to improve the step height issue. The following description will detail the different embodiments of the semiconductor device and the fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Please refer to FIG. 5 to FIG. 12, which illustrates schematic diagrams of a method of fabricating a semiconductor device 30 according to the second embodiment of the present disclosure. The structure of the semiconductor device 30 in the present embodiment is substantially the same as the semiconductor device 10 of the aforementioned first embodiment, all the similarity will not be redundantly described hereinafter. The main difference between the present embodiment and the aforementioned first embodiment is in that the fabricating method of the present embodiment omits the thick gate recessing process.

Figure 5:
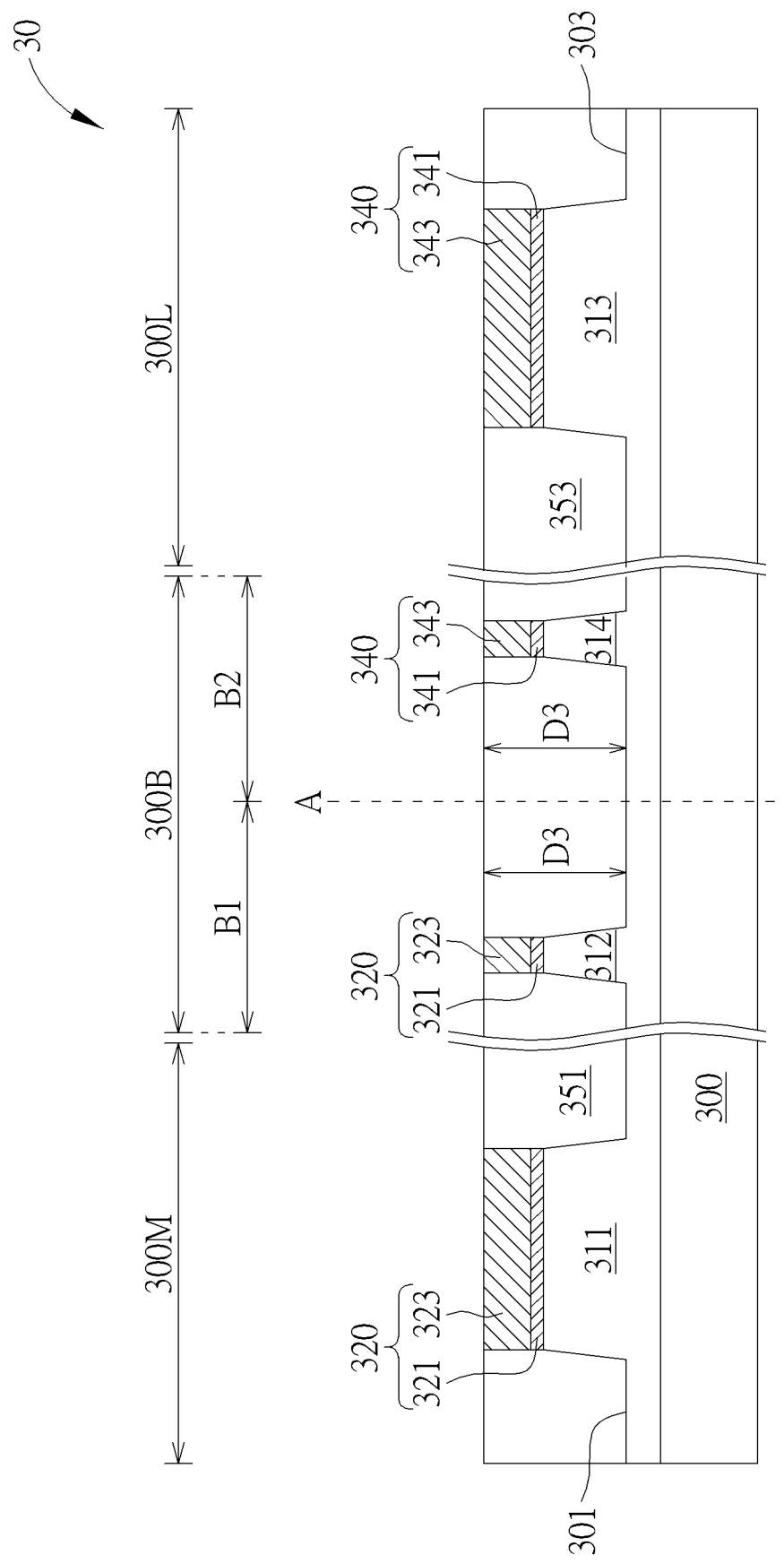

Firstly, a substrate 300 is provided, the substrate 300 includes at least three regions, for example a medium-voltage region 300M for forming medium-voltage components such as semiconductor transistors suitable for medium-voltage operation, a low-voltage region 300L for forming low-voltage components such as semiconductor transistors suitable for low-voltage operation, and a boundary region 300B between the medium-voltage region 300M and the low-voltage region 300L, wherein the boundary region 300B may further be divided into a first boundary region B1 closed to the medium-voltage region 300M, a second boundary region B2 closed to the low-voltage region 300L, and a boundary line "A" between the first boundary region B1 and the second boundary region B2, as shown in FIG. 5. Next, a plurality of shallow trench isolations 351, 353 is formed in the substrate 300, and the practical fabricating process thereof is substantially the same as the fabricating process of the aforementioned shallow trench isolations 151, 153, with all the similarity being not redundantly described hereinafter. It is noted that the thick gate recessing process of the aforementioned embodiment is omitted in the present embodiment, and a mask structure 320 including a first layer 321 and a second layer 323 stacked from bottom to top, and a mask structure 340 including a first layer 341 and a second layer 343 stacked from bottom to top are directly formed on the substrate 300, and an etching process is performed to the substrate 300 through the mask structure 320 and the mask structure 340, to form a plurality of active areas 311, 312 and a plane 301 between the active areas 311, 312 in the medium-voltage region 300M and in the first boundary region B1, and also, to from a plurality of active areas 313, 314 and a plane 303 between the active areas 313, 314 in the low-voltage region 300L and in the second boundary region B2 at the same time. Then, a deposition process and a planarization process are sequentially performed to form the shallow trench isolations 351, 353. Accordingly, the plane 301 may be flush with the plane 303, the top surface of each of the active areas 311, 312, 313, 314 may be coplanar with each other, and the top surfaces of the shallow trench isolations 351, 353 may also be coplanar with each other to obtain a same depth D3, as shown in FIG. 5.

Figure 6:
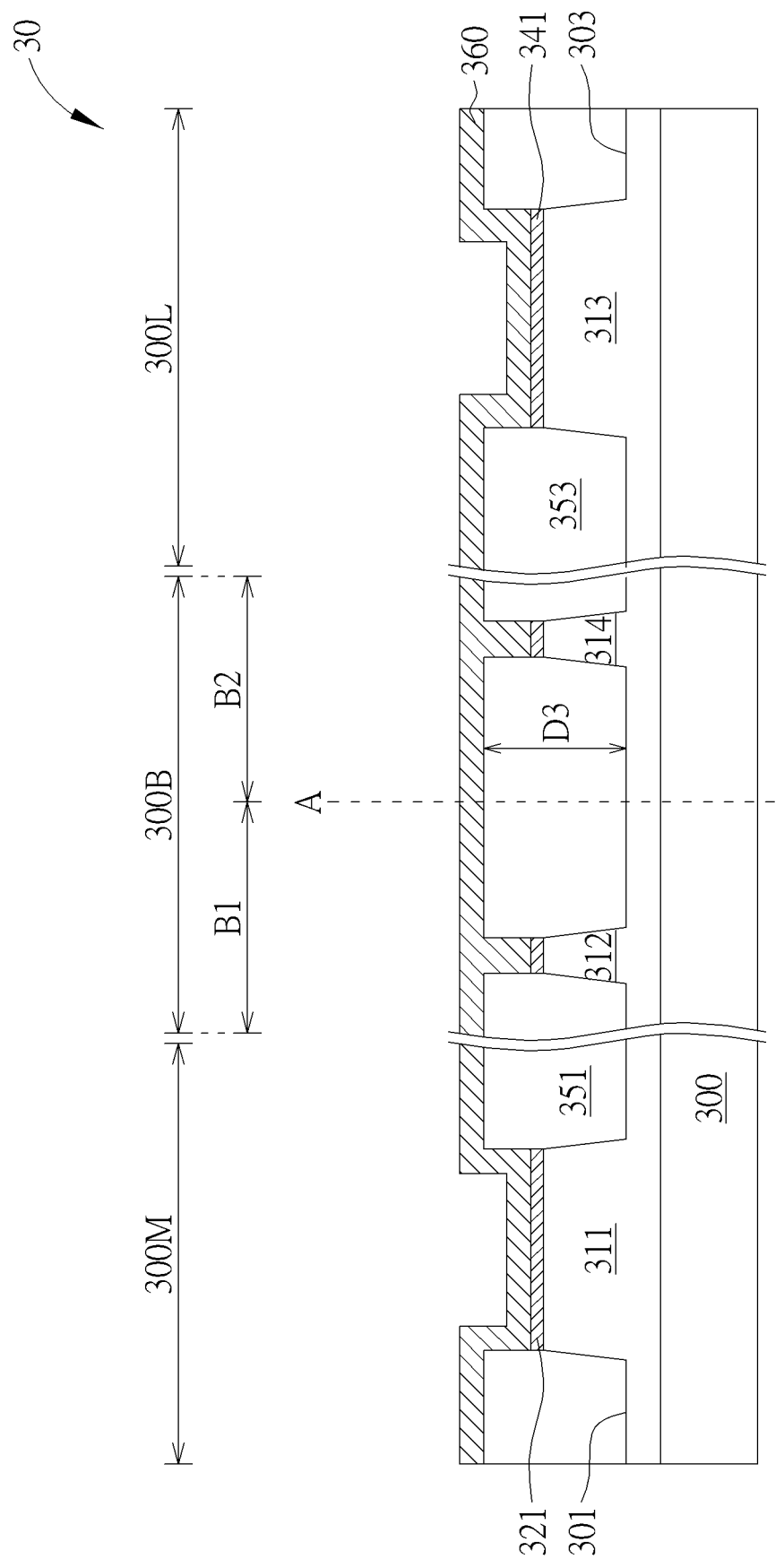

As shown in FIG. 6, another etching process is performed to optionally remove the second layers 323, 324 (for example including silicon oxide) of the mask structures 320, 340, followed by forming a mask layer 360 on the substrate 300 to entirely cover the shallow trench isolations 351, 353, and the first layers 321, 341 of the mask structures 320, 340. The mask layer 360 may completely fill in the space formed by removing the second layers 323, 343 above the active areas 312, 314 with a relative narrow pitch, and partially fill in the space formed by removing the second layers 323, 343 above the active areas 311, 313 with a relative wider pitch, but not limited thereto. Furthermore, in one embodiment, the mask layer 360 for example includes a material like silicon nitride, silicon oxynitride (SiON), or silicon carbonitride (SiCN), preferably includes a material which is the same as that of the second layers 323, 343, but is not limited thereto.

Figure 7:
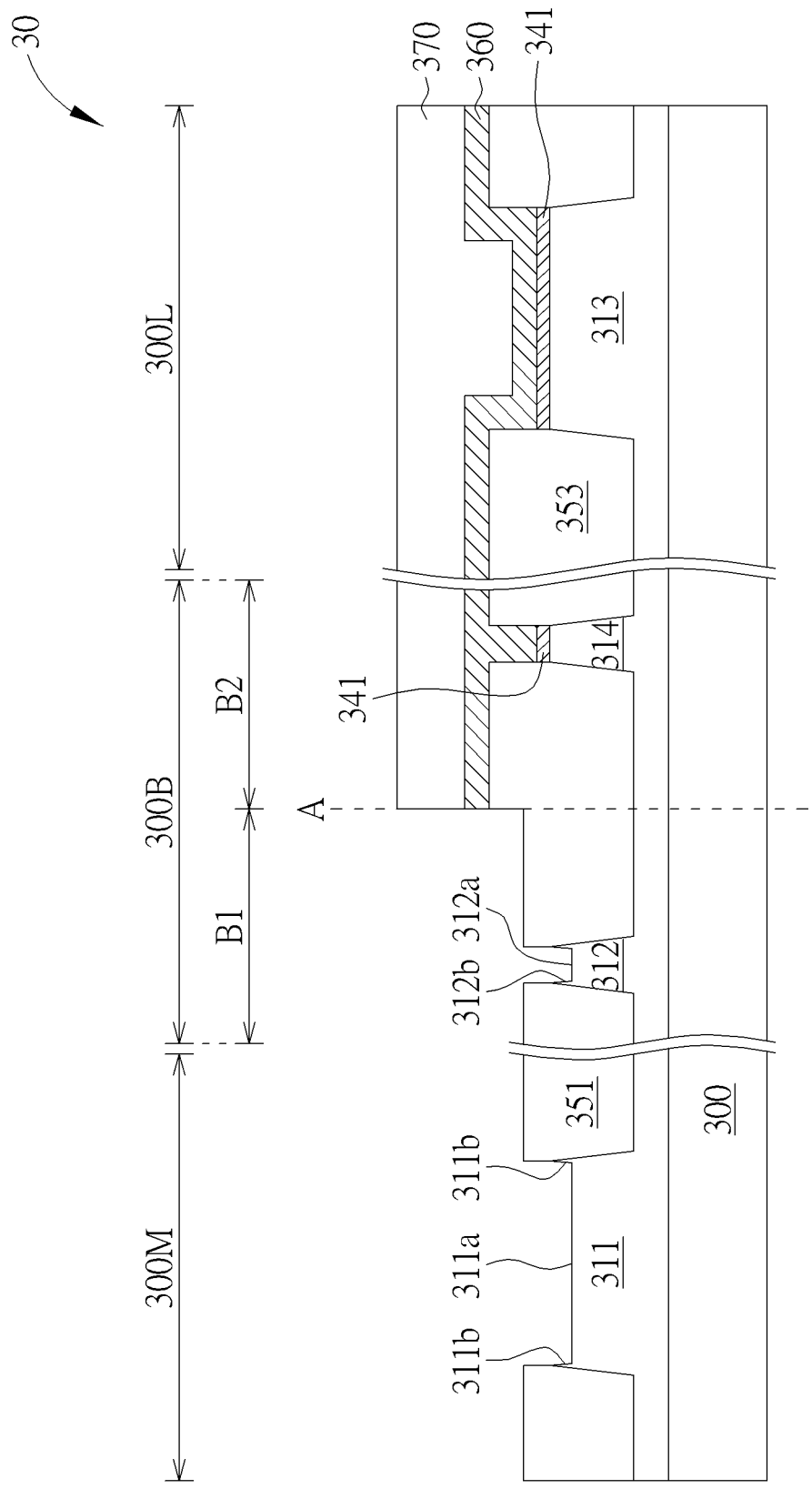

Next, as shown in FIG. 7, a mask layer 370 is formed on the mask layer 360, to cover on the low-voltage region 300L and the second boundary region B2. Then, a first etching process such as a dry etching process is performed through the mask layer 370, to completely remove the mask layer 360 in the medium-voltage region 300M and the first boundary region B1, with the rest portion of the mask layer 360 being only remained in the low-voltage region 300L and the second boundary region B2, and to further remove the first layer 321, a portion of the active areas 311, 312, and a portion of the shallow trench isolations 351 underneath. After that, the mask layer 370 is removed. Then, the active areas 311, 312 in the medium-voltage region 300M and in the first boundary region B1 may obtain surfaces 311a, 312a with a relative lower height respectively, and the shallow trench isolations 351 also obtains a relative lower top surface.

Figure 8:
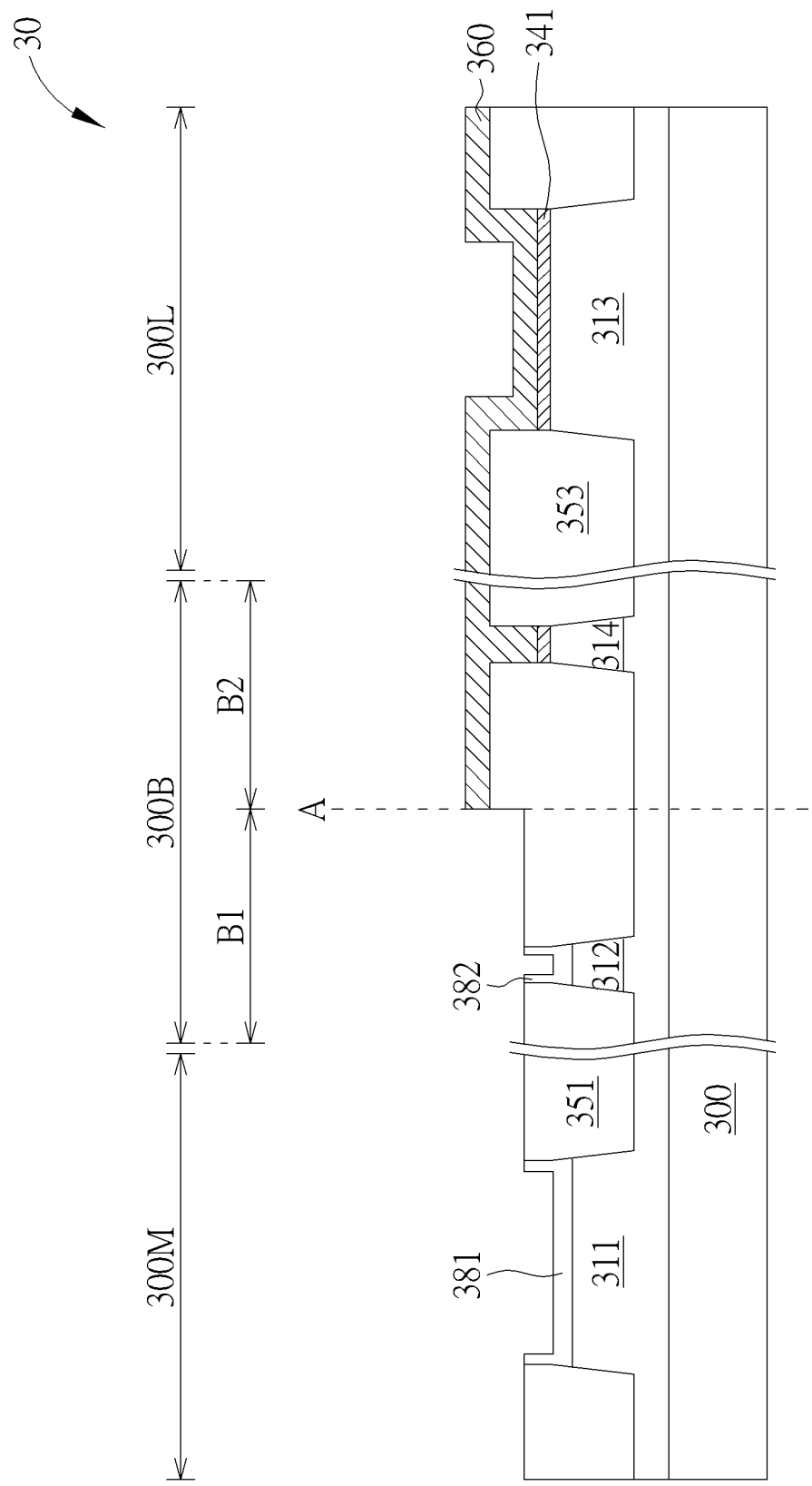

It is noted that, the etched surfaces of the active areas 311, 312 may become too rough while removing the active areas 311, 312, such that, a plurality of protrusions 311b, 312b protruded from the surfaces 311a, 312a may be formed on sidewalls of the shallow trench isolations 351, wherein each of the protrusions 311b, 312b may have a horn shape, as shown in FIG. 7. With these performances, an oxidation process such as a thermal oxidation process may be additionally performed after the first etching process in the present embodiment, for removing the damaged surfaces of the active areas 311, 312, and then, sacrificial layers 381, 382 are respectively formed on the active areas 311, 312 accordingly, as shown in FIG. 8. In the thermal oxidation process, oxygen is introduced to oxidize the surfaces 311a, 312a and the protrusions 311b, 312b of the active areas 311, 312, so that, the sacrificial layers 381, 382 may include a material like silicon oxide to obtain a relative greater volume. Also, each of the sacrificial layers 381, 382 may have an U-shaped structure in a cross-sectional view of FIG. 8.

Figure 9:
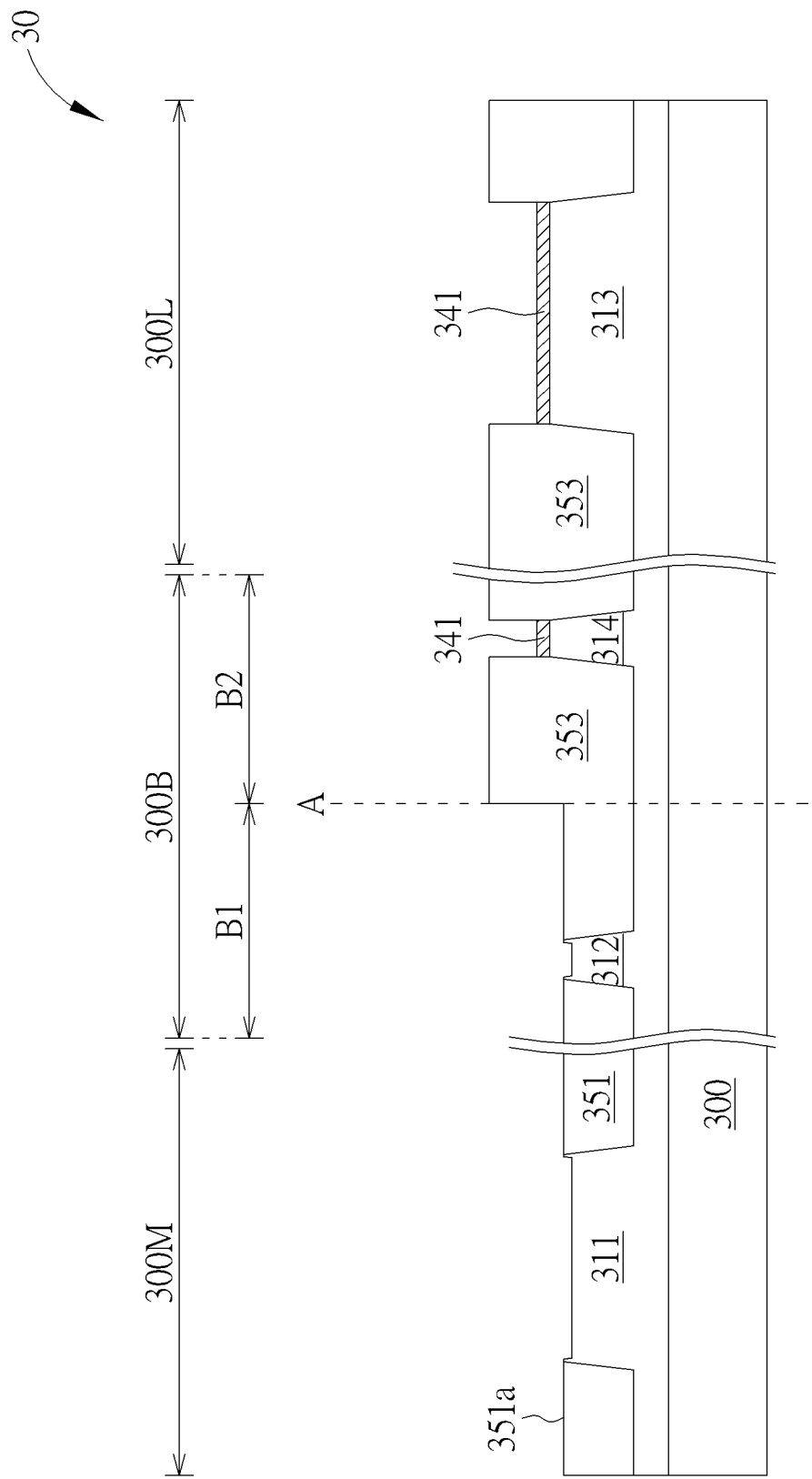

As shown in FIG. 9, a second etching process is performed to completely remove the mask layer 360 in the low-voltage region 300L and in the second boundary region B2, and also, to completely remove the sacrificial layers 381, 382 in the medium-voltage region 300M and in the first boundary region B1, thereby exposing the top surfaces of the active areas 311, 312. On the other hand, the shallow trench isolations 351 are partially removed through the second etching process, to further control the step height of the shallow trench isolations 351. Accordingly, the shallow trench isolations 351 in the medium-voltage region 300M and in the first boundary region B1 may obtain a relative lower top surface 351a which is slightly higher than the top surfaces of the active areas 311, 312 and is obviously lower than the top surface of the shallow trench isolations 353 in the low-voltage region 300L.

Figure 10:
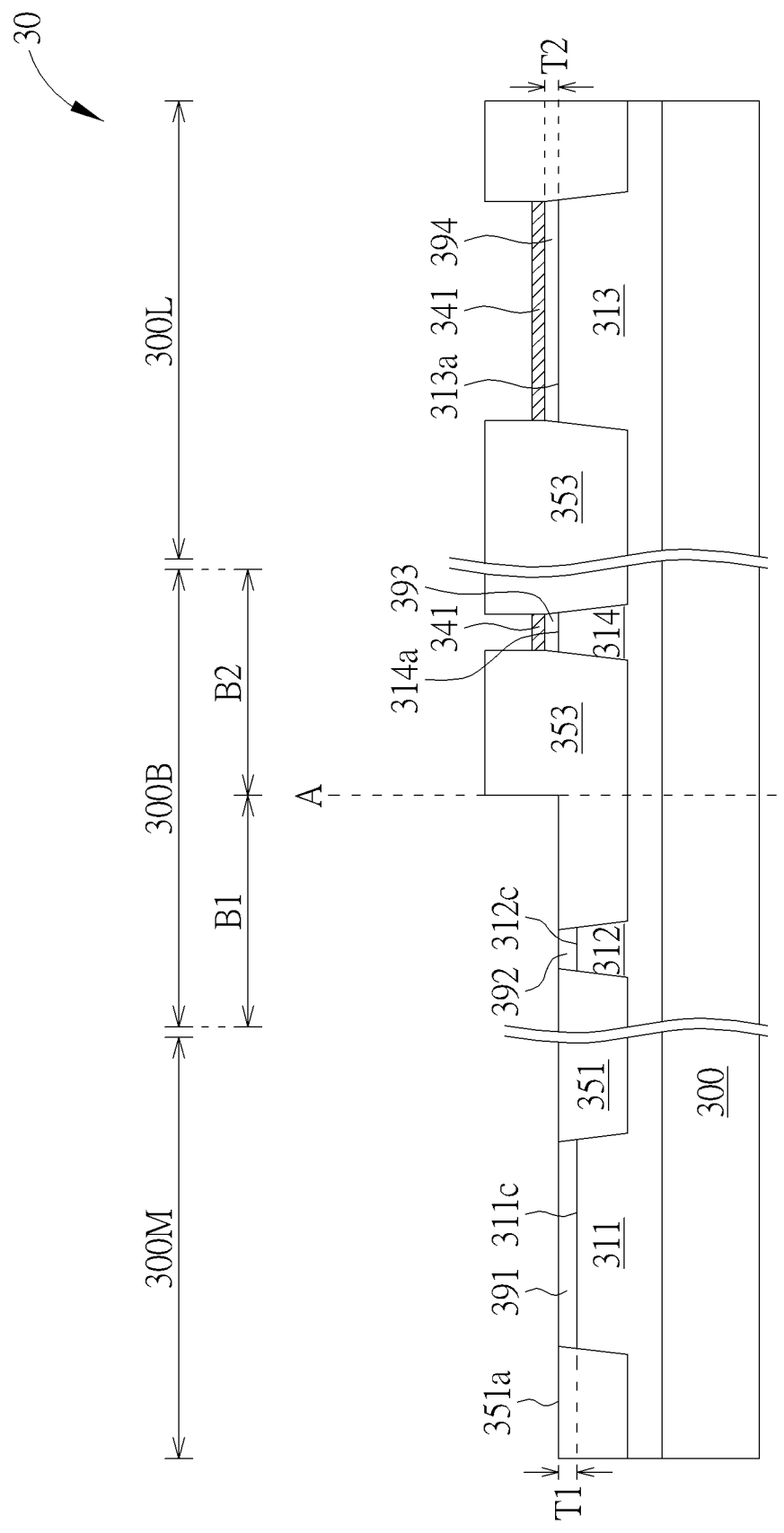

Then, as shown in FIG. 10, another oxidation process such as a thermal oxidation process is performed to form oxide layers 391, 392 on the top surfaces of the active areas 311, 312, and also, to form oxide layers 393, 394 on the active areas 313, 314, below the first layer 341, wherein the oxide layers 391, 392 may be served as a gate dielectric layers respectively. It is noted that, while performing the another oxidation process, the oxygen is introduced to directly react with the exposed top surfaces of the active areas 311, 312, so that, the oxide layers 391, 392 may obtain a relative greater thickness T1. However, the oxygen indirectly reacts with the top surfaces of the active areas 313, 314 through the first layer 341, so that, the oxide layers 393, 394 may obtain a relative smaller thickness T2, as shown in FIG. 10. Preferably, through controlling the another oxidation process, the top surfaces of the oxide layers 391, 392 may be coplanar with the top surface 351a of the shallow trench isolations 351 in the medium-voltage region 300M in and the first boundary region B1, and also, may be flush with the bottom surfaces of the oxide layers 393, 394 in the low-voltage region 300L and in the second boundary region B2, as shown in FIG. 10. In other words, in the present embodiment, the oxide layers 391, 392 within the medium-voltage region 300M and the first boundary region B1 are respectively disposed on planes 311c, 312c of the active areas 311, 312, and the oxide layers 393, 394 within the low-voltage region 300L and the second boundary region B2 are respectively disposed on planes 313a, 314a of the active areas 313, 314, wherein the planes 313a, 314a are higher than the planes 311c, 312c, but are coplanar with the top surfaces of the oxide layers 391, 392.

Figure 11:
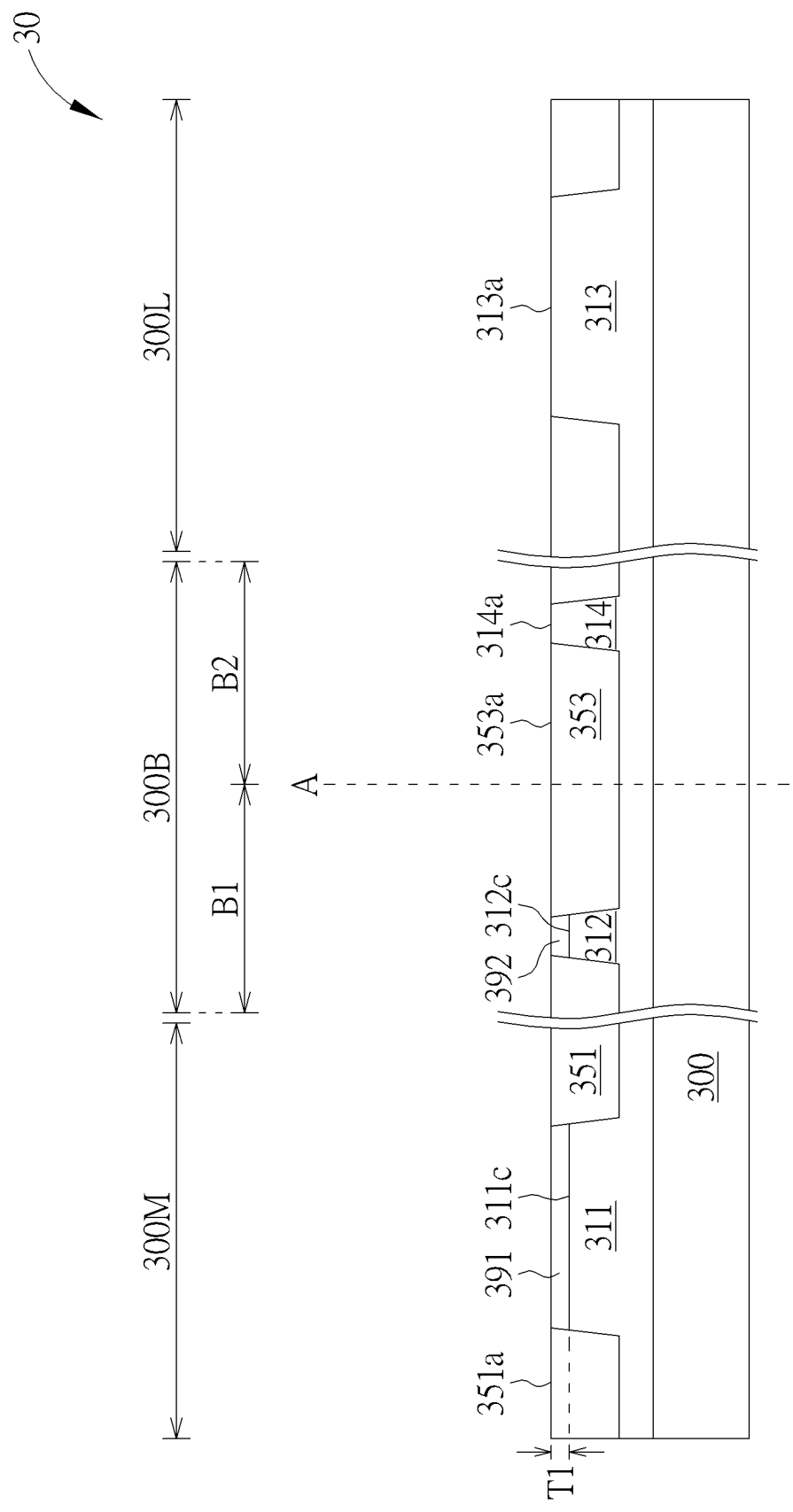

Following these, a third etching process is performed through a mask layer (not shown in the drawings) covering the medium-voltage region 300M and the first boundary region B1, to completely remove the first layer 341 and the oxide layers 393, 394 underneath in the low-voltage region 300L and in the second boundary region B2, thereby exposing the planes 313a, 314a, and also, to partially remove the shallow trench isolations 353. Then, the shallow trench isolations 353 may therefore obtain a top surface 353a being coplanar with the planes 313a, 314a, as shown in FIG. 11.

Figure 12:
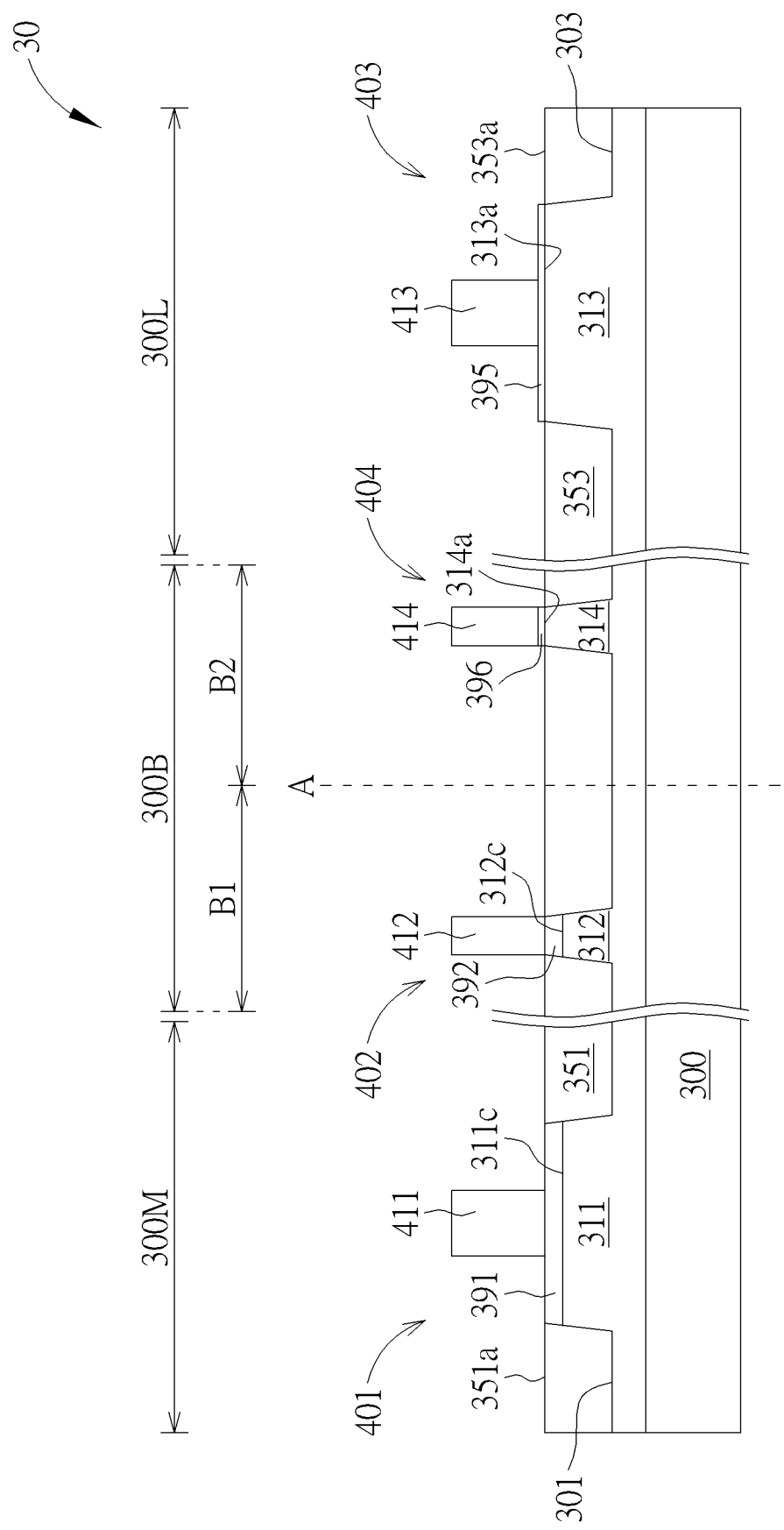

After that, the mask layer is removed, and as shown in FIG. 12, gate dielectric layers 395, 396 are respectively formed on the planes 313a, 314a. Then, a plurality of gate electrodes 411, 412, 413, 414 are simultaneously formed on the oxide layers 391, 392, and on the dielectric layers 395, 396, respectively, to simultaneously form a transistor 401 in the medium-voltage region 300M, transistors 402, 404 in the boundary region 300B, and a transistor 403 in the low-voltage region 300L thereby.

Through the aforementioned processes, the fabrication of the semiconductor device 30 according to the second embodiment of the present disclosure is accomplished. In the fabricating method of the present embodiment, the thick gate recessing is omitted, and the first etching process as shown in FIG. 7 is directly used to dramatically reduce the step height of the shallow trench isolations 351 and the active areas 311, 312 in the medium-voltage region 300M and in the first boundary region B1, and the second etching process as shown in FIG. 9 is then used to further adjust the precise step height of the shallow trench isolations 351 and the active areas 311, 312. Accordingly, the thickness T1 of the gate dielectric layers (namely the oxide layers 391) in the medium-voltage region 300M may be precisely controlled, with the oxide layers 391, 392 being formed to be coplanar with the top surface 351a of the shallow trench isolations 351 in the medium-voltage region 300M. On the other hand, the thickness T2 of the oxide layers 393, 394 in the low-voltage region 300L and in the second boundary B2 is also controlled through the second etching process as shown in FIG. 9, so that, the planes 313a, 314a which are coplanar with the top surfaces of the oxide layers 391, 392 may be formed by using the subsequent third etching process as shown in FIG. 11 to remove the oxide layers 393, 394 and the shallow trench isolations 353. With these performances, the fabricating method of the present embodiment not only effectively improve the obvious height difference between the medium-voltage region 300M and the low-voltage region 300L in the substrate 300 caused by the relative greater thickness of the gate dielectric layer in the medium-voltage region 300M, but also achieve a whole coplanar top surface in the boundary region 300B between the medium-voltage region 300M and the low-voltage region 300L. Also, the fabricating method of the present embodiment enables to additionally trim the etched surfaces of the active areas 311, 312 through the oxidation process as shown in FIG. 8, so as to remove the protrusions 311b, 312b formed on the active areas 311, 312 after the first etching process. In this way, it is sufficiently to improve the flatness of the gate dielectric layers (namely the oxide layer 391) formed in the medium-voltage region 300M in the subsequent processes. People well skilled in the art should easily understand that the oxidation process may also be omitted in another embodiment due to the practical etching status of the active areas 311, 312. In addition, since the thick gate recessing process is omitted in the fabricating method of the present embodiment, the number of the require mask layer during the fabricating method may be reduced to save the cost. Therefore, the fabricating method of the present embodiment is beneficial not only on integrating the fabrications of the medium-voltage components and the low-voltage components, but also on enhancing the element performances of the semiconductor device.

On the other hand, in the semiconductor device 30 of the present embodiment, the transistors 401, 402, 403, 404 are respectively disposed within various regions to apply to different voltage ranges, wherein the transistor 401 disposed within the medium-voltage region 300M may be apply to a medium-voltage operation, the transistor 403 disposed within the low-voltage region 300L may be apply to a low-voltage operation, and the transistors 402, 404 disposed within the boundary region 300B may be function like dummy gate structures or apply to other voltage ranges. It is noted that, in the present embodiment, the top surface of the transistors 401, 402, 403, 404 disposed in each region may be coplanar with each other, and the top surface of the shallow trench isolations 351 disposed in the medium-voltage region 300M, the top surface of the shallow trench isolations 353 disposed in the low-voltage region 300L, and the top surface of the shallow trench isolations 351, 353 disposed in the boundary region 300B may be coplanar with each other, and also be flush with the top surface of the gate dielectric layer (namely the oxide layer 391) of the transistor 401. In this way, the semiconductor device 30 of the present embodiment may therefore include transistors 401, 402, 403, 404 with the same height, as well as the shallow trench isolations 351, 353 with the same depth, for achieving more optimized device performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate, having a medium-voltage region, a low-voltage region, and a boundary region between the medium-voltage region and the low-voltage region;
   a first transistor disposed in the medium-voltage region, wherein the first transistor comprises:
      a first plane on the substrate;
      a first gate dielectric layer on the first plane; and
      a first gate electrode on the first gate dielectric layer;
   a second transistor disposed in the boundary region, wherein the second transistor comprises:
      a second plane on the substrate;
      a second gate dielectric layer on the second plane; and
      a second gate electrode on the second gate dielectric layer;
   a third transistor disposed on the low-voltage region, wherein the third transistor comprises:
      a third plane on the substrate;
      a third gate dielectric layer disposed on the third plane, wherein the first plane is coplanar with the second plane, and the third plane is higher than the first plane and the second plane; and
      a third gate electrode disposed on the third gate dielectric layer; and
   a plurality of shallow trench isolations disposed in the substrate, within the medium-voltage region, the boundary region and the low-voltage region respectively, wherein top surfaces of the shallow trench isolations in the medium-voltage region, the boundary region and the low-voltage region are coplanar with top surfaces of the first gate dielectric layer and the second gate dielectric layer.

2. The semiconductor device according to claim 1, wherein a thickness of the first gate dielectric layer is the same as a thickness of the second gate dielectric layer.

3. The semiconductor device according to claim 1, wherein the third plane is coplanar with the top surface of the first gate dielectric layer.

* * * * *